United States Patent
Hsueh et al.

(10) Patent No.: US 8,400,199 B2
(45) Date of Patent: Mar. 19, 2013

(54) CHARGE PUMP, PHASE FREQUENCY DETECTOR AND CHARGE PUMP METHODS

(75) Inventors: Yu-Li Hsueh, New Taipei (TW); Yi-Hsien Cho, Hsinchu County (TW); Jing-Hong Conan Zhan, HsinChu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 109 days.

(21) Appl. No.: 13/095,873

(22) Filed: Apr. 28, 2011

(65) Prior Publication Data

US 2012/0133404 A1 May 31, 2012

Related U.S. Application Data

(60) Provisional application No. 61/417,291, filed on Nov. 26, 2010.

(51) Int. Cl.
*H03L 7/06* (2006.01)
(52) U.S. Cl. .................... 327/157; 327/148
(58) Field of Classification Search .............. 327/148, 327/157
See application file for complete search history.

(56) References Cited

U.S. PATENT DOCUMENTS

| | | | | |
|---|---|---|---|---|
| 5,699,387 | A * | 12/1997 | Seto et al. | 375/376 |
| 6,897,733 | B2 * | 5/2005 | Wakayama | 331/17 |
| 7,042,970 | B1 | 5/2006 | Keaveney | |
| 7,082,176 | B2 | 7/2006 | Chien | |
| 2003/0231729 | A1 * | 12/2003 | Chien et al. | 375/376 |
| 2005/0174181 | A1 * | 8/2005 | Wakayama | 331/16 |
| 2005/0189973 | A1 * | 9/2005 | Li | 327/157 |
| 2010/0213994 | A1 * | 8/2010 | Haerle | 327/158 |
| 2012/0098581 | A1 * | 4/2012 | Haerle | 327/157 |
| 2012/0133404 | A1 * | 5/2012 | Hsueh et al. | 327/157 |
| 2012/0235718 | A1 * | 9/2012 | Thakur et al. | 327/157 |

* cited by examiner

*Primary Examiner* — Adam Houston
(74) *Attorney, Agent, or Firm* — Winston Hsu; Scott Margo

(57) ABSTRACT

A charge pump being disposed in a phase locking system. The charge pump includes a sourcing element, a draining element and an offset element. The sourcing element is arranged to selectively source a first current into an output terminal of the charge pump according to a first control signal, and the draining element is arranged to selectively drain a second current from the output terminal according to a second control signal. The offset element is arranged to selectively conduct an offset current via the output terminal according to a third control signal, and one of the sourcing element and the draining element is disabled when the phase locking system is in a phase-locked state.

20 Claims, 9 Drawing Sheets

CHARGE PUMP, PHASE FREQUENCY DETECTOR AND CHARGE PUMP METHODS

CROSS REFERENCE TO RELATED APPLICATIONS

This application claims the benefit of U.S. Provisional Application No. 61/417,291, filed on Nov. 26, 2010 and included herein by reference.

BACKGROUND OF THE INVENTION

1. Field of the Invention

The present invention relates to a charge pump, a phase/frequency detector and related methods.

2. Description of the Prior Art

A charge pump (CP) is an essential component in a phase locking system for performing phase/frequency synchronization. A conventional CP usually suffers from nonlinearity due to a dead zone or undesired noise from a reference spur. In order to alleviate the dead zone issue, an offset current is added to provide a constant current to avoid the dead zone, making the performance of the CP more linear when it is phase-locked. Please refer to FIG. 1, which is an exemplary diagram of a conventional CP 1000 coupling to a voltage controlled node $V_{CTRL}$ via a loop filter 2000. The conventional CP 1000 is for conducting a current $I_{CP}$ via an output terminal N, and includes a sourcing element 1100, a draining element 1200 and an offset element 1300. The sourcing element 1100 and the draining element 1200 are dominated by control signals UP, UPB and DN, DNB, respectively, wherein the control signals UPB, DNB are inverses of the control signals UP, DN, respectively. When the phase locking system containing the conventional CP 1000 is in a phase-locked state, the sourcing element 1100 will provide an additional current to cancel out the constant current injected by the offset element 1300. In this way, the nonlinearity caused by the dead zone issue can be alleviated.

Although the addition of the offset current can successfully overcome the dead zone problem, the reference spur issue will still remain. Please refer to FIG. 2, which is a timing diagram of the conventional CP 1000 when phase-locked. When the conventional CP 1000 is in the phase-locked state, a current $I_{UP}$ generated by the sourcing element 1100 is partially cancelled out by a current IDN drained from the draining element 1200, and the other current $I_{UP}$ is cancelled by a current $I_{offset}$ drained from the offset element 1300. As a result, a total current $I_{CP}$ from the conventional CP 1000 appears to source an impulse current into a following circuit and then keeps draining a constant current from the following circuit until a next reference period. Therefore, the following voltage controlled node $V_{CTRL}$, e.g., a control node of a voltage controlled oscillator following the conventional CP 1000 via a loop filter, will experience a periodical modulation resulting in a reference spur.

In addition, please note that each electrical charge injected into or from the voltage controlled node $V_{CTRL}$ may produce undesired noise. Ideally, each current from the sourcing element 1100, the draining element 1200 and the offset element 1300 will cancel out the other currents when the phase-locked state is reached and therefore have no influence over the voltage controlled node $V_{CTRL}$; nevertheless, in practical implementation, those existing electrical charges from all current sources will still impact the overall performance of the phase locking system. It is therefore an important issue to minimize the amount of current flow involved in the phase-locked state.

SUMMARY OF THE INVENTION

It is one of the objectives of the present invention to provide a charge pump and related methods to solve the aforementioned problems.

According to a first aspect of the present invention, a charge pump disposed in a phase locking system is disclosed. The charge pump comprises a sourcing element, a draining element and an offset element. The sourcing element is arranged to selectively source a first current into an output terminal of the charge pump according to a first control signal, and the draining element is arranged to selectively drain a second current from the output terminal according to a second control signal. The offset element is arranged to selectively conduct an offset current via the output terminal according to a third control signal, wherein one of the sourcing element and the draining element is disabled when the phase locking system is in a phase-locked state.

According to a second aspect of the present invention, a phase/frequency detector (PFD) for generating a first control signal and a second control signal to a charge pump is disclosed. The PFD comprises a core circuit and a timing circuit. The core circuit is arranged to output a first phase signal and a second phase signal according to a phase/frequency difference between a reference clock signal and an input clock signal. The timing circuit is arranged to generate the first control signal and the second control signal according to the first phase signal and the second phase signal. Only one of the first control signal and the second control signal is indicative of an enabled operation when the reference clock signal and the input clock signal are substantially identical in phase.

According to a third aspect of the present invention, a charge pump is disclosed. The charge pump is arranged to conduct electrical charges via an output terminal according to a phase information, characterized in that when receiving the phase information indicative of a leading phase, the charge pump conducts the electrical charges into/from the output terminal at a predetermined rate; when receiving the phase information indicative of a lagging phase, the charge pump conducts the electrical charges from/into the output terminal at the predetermined rate; and the charge pump conducts a predetermined quantity of electrical charges via the output terminal when the phase information is indicative of a transition between the leading phase and the lagging phase.

According to a fourth aspect of the present invention, a charge pump method is disclosed. The charge pump method includes: selectively performing a sourcing operation to source a first current into an output terminal according to a first control signal; selectively performing a draining operation to drain a second current from the output terminal according to a second control signal; and selectively performing an offset operation to conduct an offset current via the output terminal according to a third control signal.

According to a fifth aspect of the present invention, a charge pump method utilized in a phase locking system is disclosed. The charge pump method is arranged to conduct electrical charges via an output terminal of a charge pump in the phase locking system according to a phase information, comprising: when receiving the phase information indicative of a leading phase, conducting the electrical charges into/from the output terminal at a predetermined rate; when receiving the phase information indicative of a lagging phase, conducting the electrical charges from/into the output terminal at the predetermined rate; and conducting a predetermined quantity of electrical charges via the output terminal when the phase information is indicative of a transition between the leading phase and the lagging phase.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
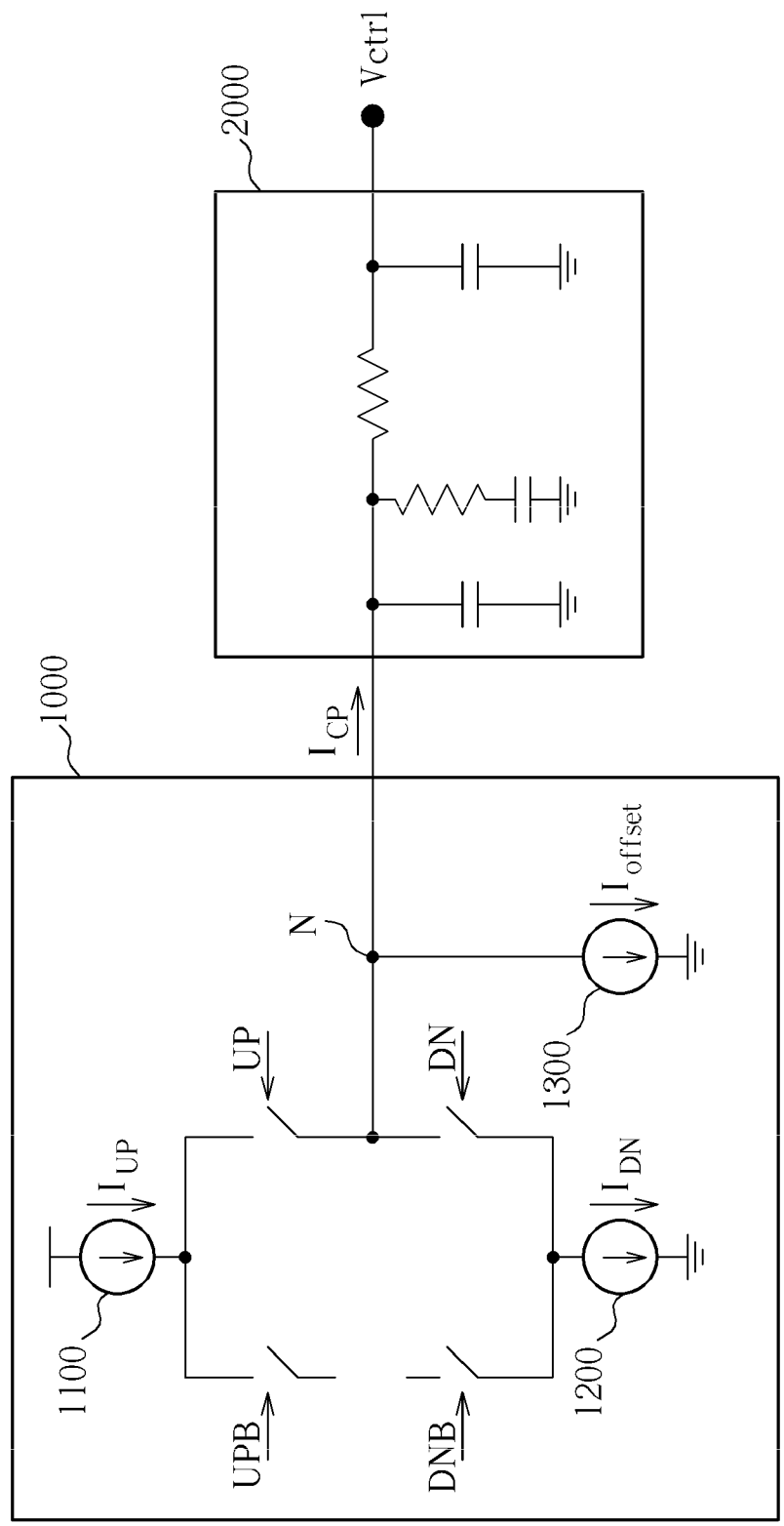
FIG. 1 is an exemplary diagram of a conventional CP coupling to a voltage controlled node via a loop filter.
Figure 2:
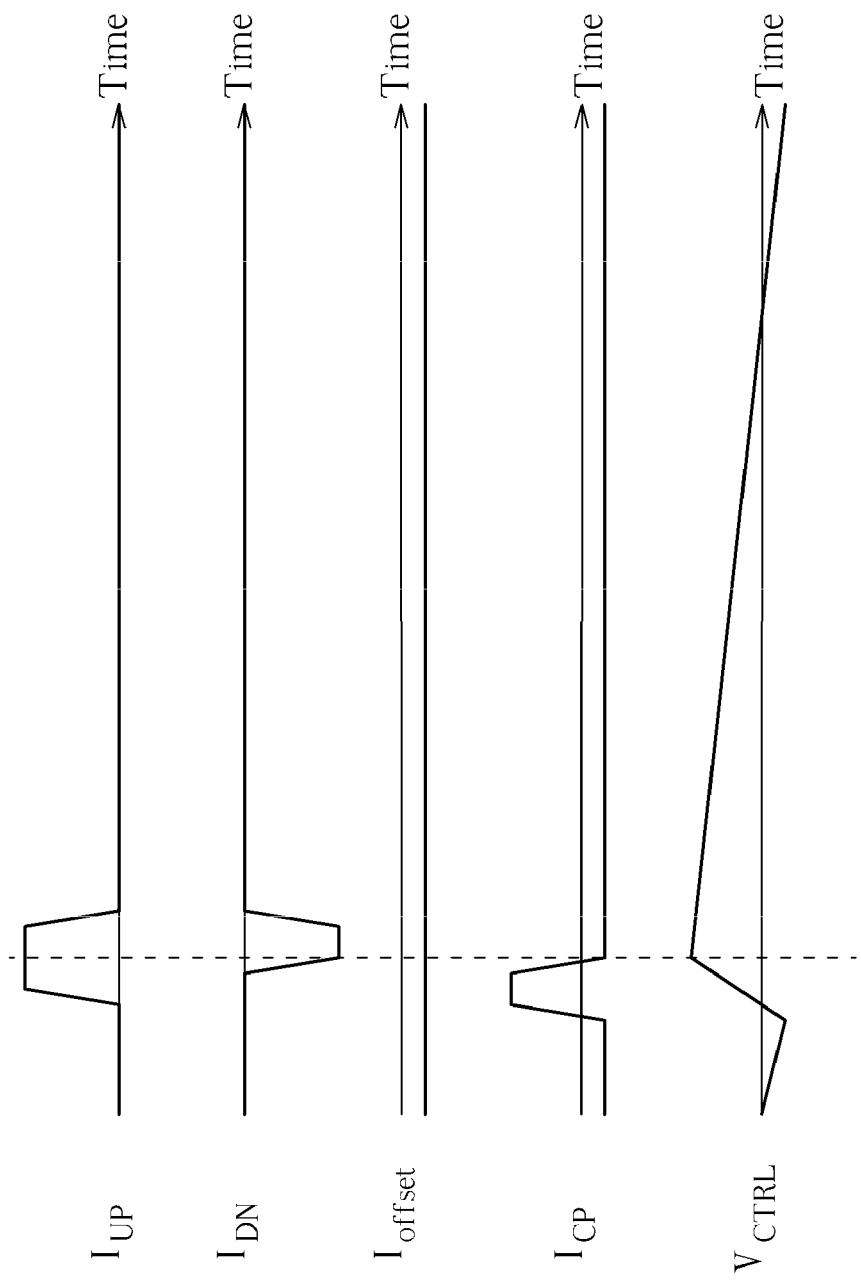
FIG. 2 is a timing diagram of the conventional CP in FIG. 1 when phase-locked.
Figure 3:
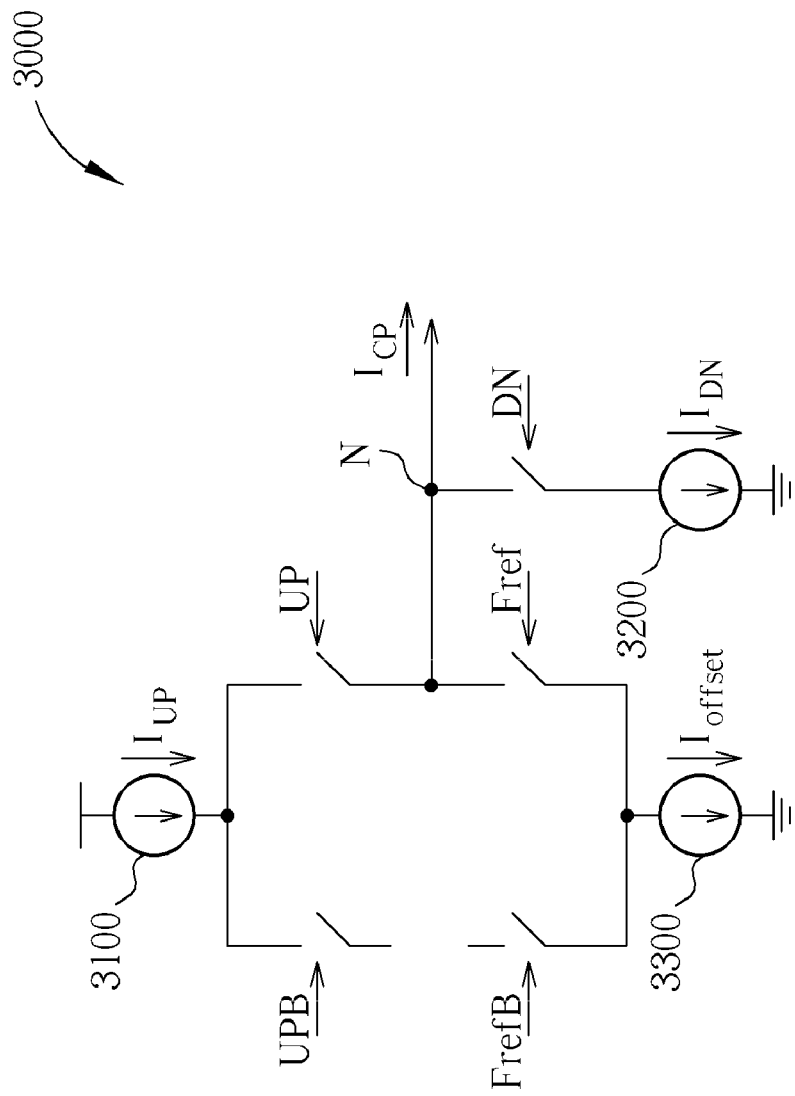
FIG. 3 is an exemplary diagram of a charge pump according to an embodiment of the present invention.

Please refer to FIG. 3, which is an exemplary diagram of a charge pump (CP) 3000 according to an embodiment of the present invention. The CP 3000 includes a sourcing element 3100, a draining element 3200 and an offset element 3300. The sourcing element 3100 and the draining element 3200 are dominated by control signals UP, UPB and DN, respectively, wherein the control UPB is an inverse of the control signal UP. Compared with the conventional CP 1000, the offset element 3300 within the CP 3000 is further controlled by control signals Fref and its inverse FrefB, wherein the control signal Fref is derived from a periodical signal (i.e., the control signal Fref can be a periodical signal or a processed result of a periodical signal) and includes an operation interval indicative of an enabled operation. In this embodiment, the control signal Fref has a frequency identical to a reference clock frequency of the phase locking system containing the CP 3000. Please note that, before the phase locking system exploiting the CP 3000 is in the phase-locked state, i.e., when the phase locking system is still performing phase tracking operation, the offset element 3300, the sourcing element 3100 and the draining element 3200 are enabled to be conductive simultaneously. In this way, all the electrical charges conducted by all three current branches help to speed up the phase tracking process.

Figure 4:
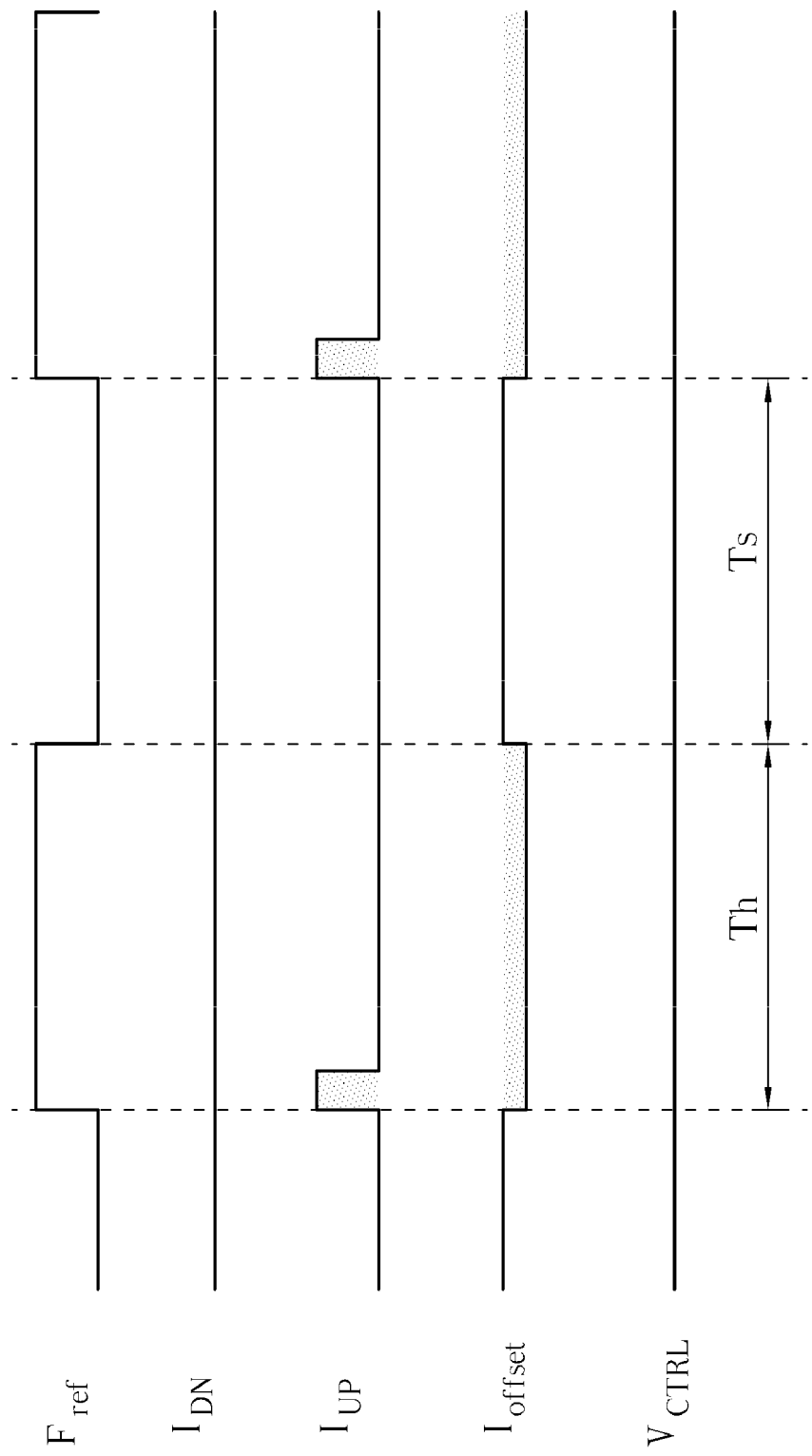
FIG. 4 is a timing diagram of the CP in FIG. 3 when reaching the phase-locked state according to an embodiment of the present invention.

Please refer to FIG. 4 for operation details of the CP 3000. FIG. 4 is a timing diagram of the CP 3000 when the CP 3000 reaches the phase-locked state according to an embodiment of the present invention. When attaining the phase-locked state, the draining element 3200 is disabled completely, and the offset element 3300 drains a constant current $I_{offset}$ while the control signal Fref is indicative of an enabled operation (in other words, when the control signal Fref is in the operation interval). In FIG. 4, the control signal Fref can be divided into two time intervals: a sampling interval Ts (i.e., the operation interval) and a holding interval Th (i.e., the disabled interval). During the sampling interval Ts, the sourcing element 3100 provides an impulse current $I_{UP}$ to cancel out the current $I_{offset}$ from the offset element 3300, i.e., the charge amount injected from the sourcing element 3100 substantially equals a charge amount flowing into the offset element 3300, and therefore no electrical charge is injected into the output terminal N. During the holding interval, all elements within the CP 3000 are disabled and no current transition at the output terminal N of the CP 3000. The disabled current branch can thus be implemented within a relatively small area, since its noise concern is relaxed. In addition, the offset current $I_{offset}$ is smaller than a sourcing current $I_{UP}$ from the sourcing element 3100 or a draining current $I_{DN}$ into the draining element 3200, therefore the implementation of the offset element 3300 only requires a small on-chip area. This means that, when reaching the phase-locked state, only the sourcing current $I_{UP}$ and the offset current $I_{offset}$ are involved, resulting in a reduced current flow and a better noise performance.

Figure 5:
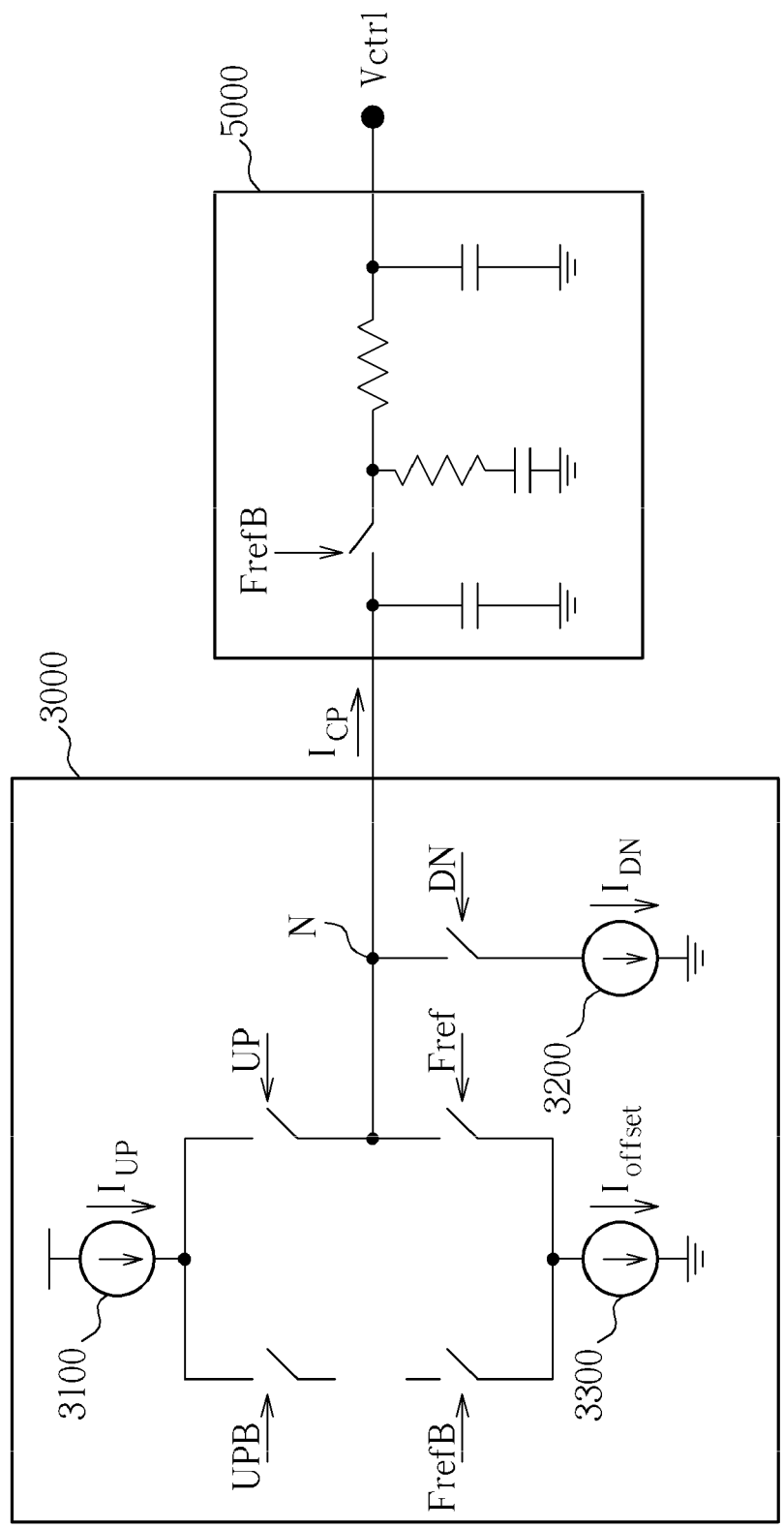
FIG. 5 is a diagram of the CP in FIG. 3 coupling to a voltage controlled node via a loop filter according to an embodiment of the present invention.

Please refer to FIG. 5 for an exemplary application of the CP 3000 in practical implementation. FIG. 5 is a diagram of the CP 3000 coupling to a voltage controlled node $V_{CTRL}$ via a loop filter 5000 according to an embodiment of the present invention. The structure of the loop filter 5000 includes a switching element for selectively connecting the output terminal N of the CP 3000 to the voltage controlled node $V_{CTRL}$ according to the control signal FrefB (the inverse of the control signal Fref). When the control signal Fref is indicative of a holding operation (i.e., during holding interval Th), the offset element 3300 conducts the offset current $I_{offset}$ via the output terminal N, and the output terminal N is electrically isolated from the voltage controlled node $V_{CTRL}$; when the control signal Fref is indicative of a sampling operation (i.e., during the sampling interval Ts), the offset element is electrically isolated from the output terminal N and the output terminal N is coupled to the voltage controlled node $V_{CTRL}$ via the switching element. In this way, the operations of both the CP 3000 and the loop filter 5000 are divided into two intervals (sampling and holding intervals), the reference spur is therefore avoided and the phase locking system containing the CP 3000 and the loop filter 5000 can achieve better spur performance more easily.

Figure 6:
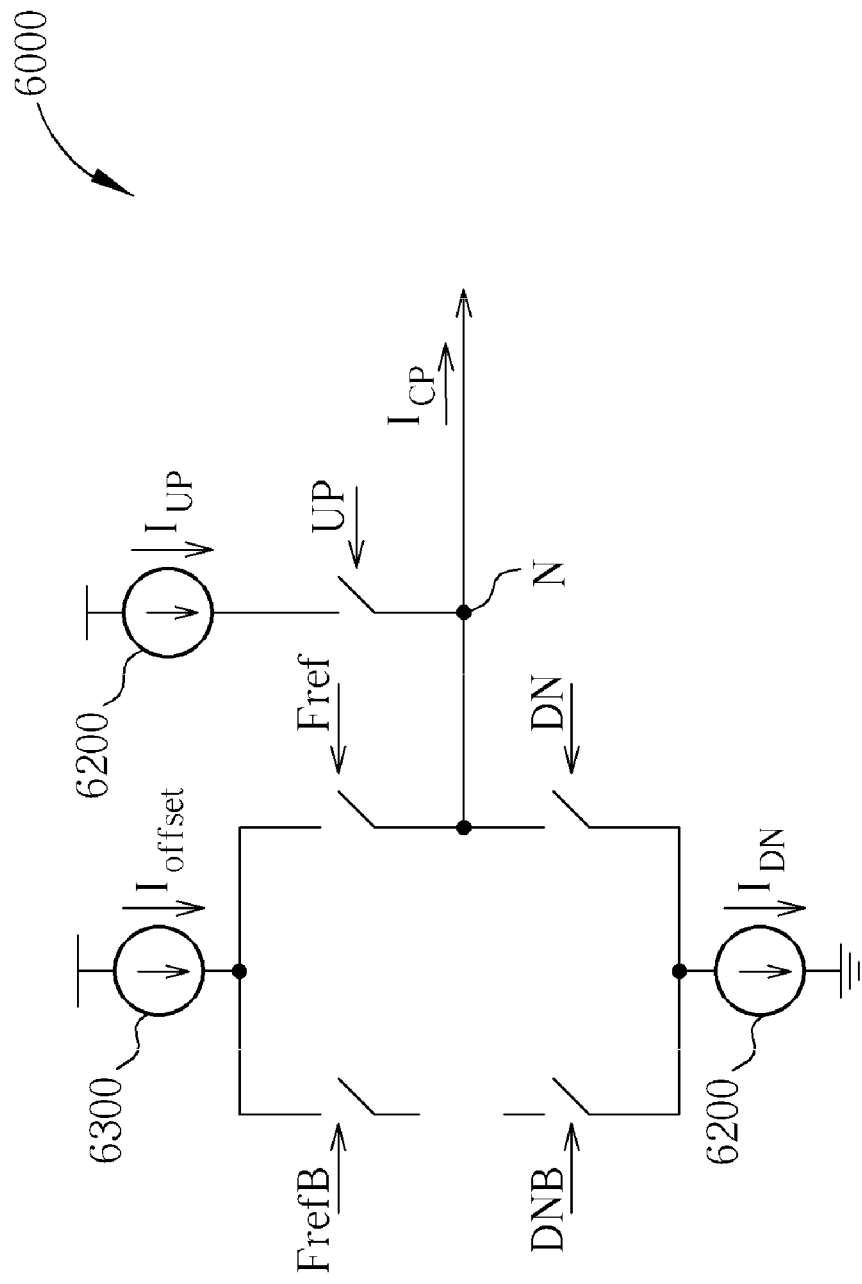
FIG. 6 is an exemplary diagram of a CP according to another embodiment of the present invention.
Figure 7:
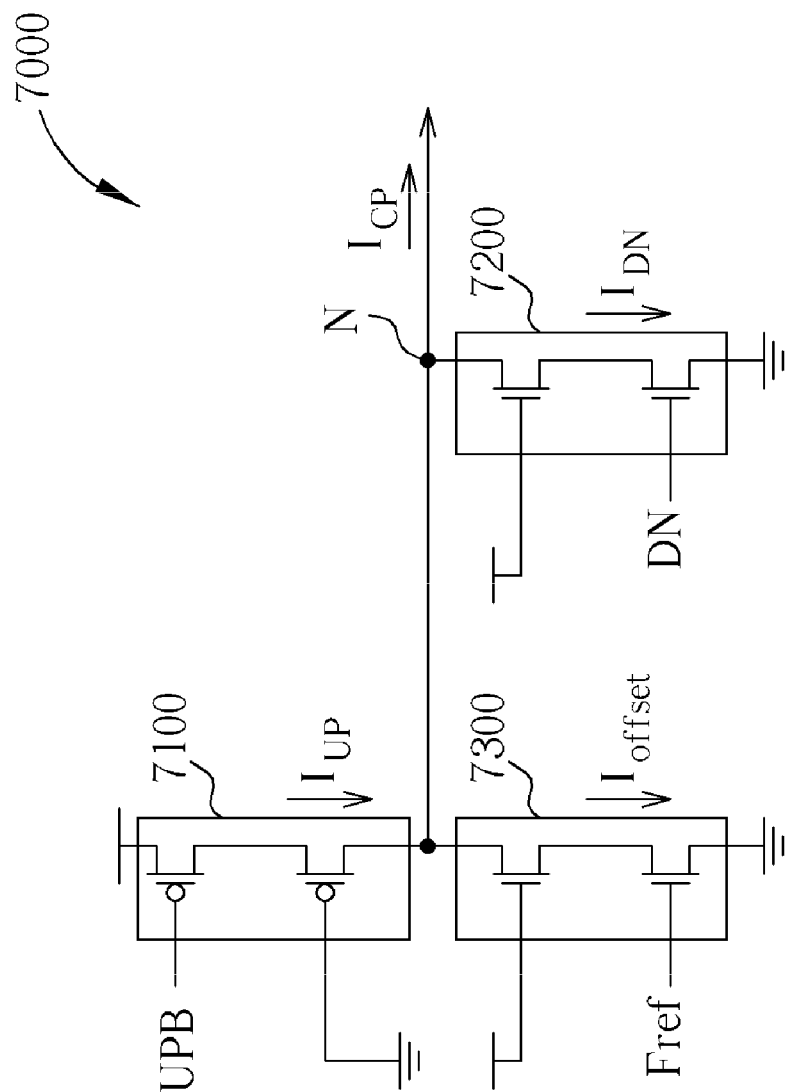
FIG. 7 is an exemplary diagram of a single-ended CP according to yet another embodiment of the present invention.

Please note that the embodiment in FIG. 3 disposes the offset element 3300 as a current draining element; however, this is not supposed to be a limitation to the present invention. Please refer to FIG. 6, which is an exemplary diagram of a CP 6000 according to another embodiment of the present invention. An offset element 6300 is disposed as a current sourcing element to cancel out a current flowing into a draining element 6200 while the CP 6000 is phase-locked. In this case, the sourcing element 6100 is disabled in the phase-locked state. In addition, the present invention can also be realized in a single-ended fashion. Please refer to FIG. 7, which is an exemplary diagram of a single-ended CP 7000 according to yet another embodiment of the present invention. The single-ended CP 7000 also includes a sourcing element 7100, a draining element 7200 and an offset element 7300. The sourcing element 7100 and the draining element 7200 are dominated by control signals UPB and DN via corresponding transistors, respectively, and the offset element 7300 is under control of a control signal Fref. As long as a CP includes an offset element which selectively provides a constant current according to a control signal, these kinds of CP designs fall within the scope of the present invention.

Figure 8:
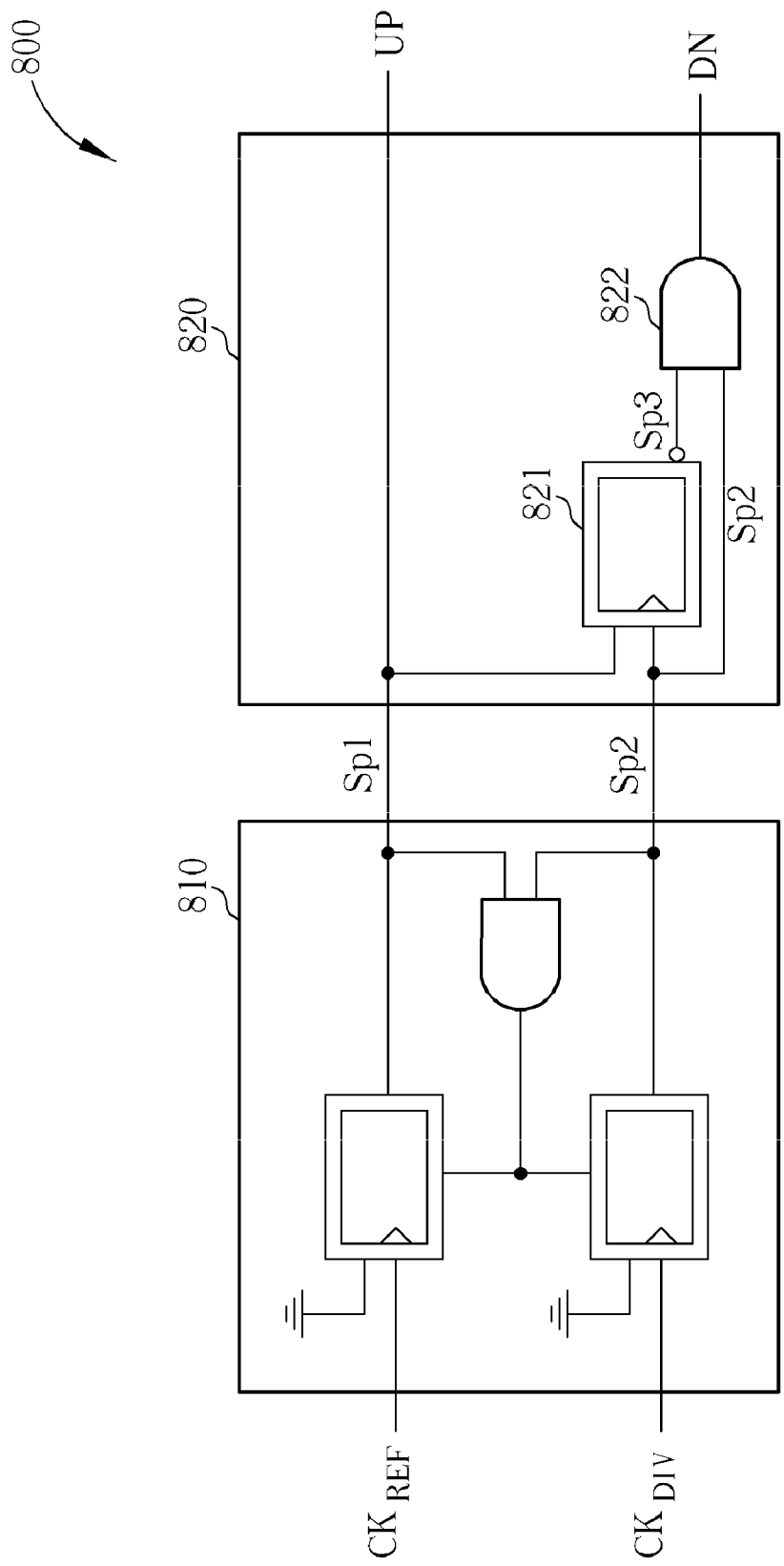
FIG. 8 is an exemplary diagram of a phase/frequency detector for providing control signals to the CP in FIG. 3 according to an embodiment of the present invention.

Please refer to FIG. 8, which is an exemplary diagram of a phase/frequency detector (PFD) 800 for providing control signals UP and DN to the CP 3000 according to an embodiment of the present invention. The PFD 800 includes a core circuit 810 and a timing circuit 820. The core circuit 810, which is commonly used in typical PFD structures, outputs a first phase signal Sp1 and a second phase signal Sp2 according to a phase/frequency difference between a reference clock signal $CK_{REF}$ and an input clock signal $CK_{DIV}$, the timing circuit 820 generates the control signal UP and the control signal DN according to the first phase signal Sp1 and the second phase signal Sp2. In this embodiment, the timing circuit 820 directly outputs the first phase signal Sp1 as the control signal UP, and the timing circuit 820 includes a D flip-flop (DFF) 821 and an AND gate 822. The DFF 821 is for outputting a third phase signal Sp3 according to the first phase signal Sp1 and the second phase signal Sp2. The AND gate 822 is for outputting the control signal DN according to the second phase signal Sp2 and the third phase signal Sp3. Please note that, with the help of the DFF 821, only one of the control signals UP and DN is indicative of an enabled operation when the reference clock signal $CK_{REF}$ and the input clock signal $CK_{DIV}$ are substantially identical in phase, i.e., when the system is substantially phase-locked. In this way, when a phase/frequency difference exists between the reference clock signal $CK_{REF}$ and the input clock signal $CK_{DIV}$, the PFD 800 operates normally to command the CP 3000 to adjust the difference. When the system approaches the phase-locked state, the PFD 800 is capable of ensuring only one of the sourcing element 3100 and the draining element 3200 is disabled while the other conducts a current to cancel out the offset current from the offset element 3300. As a result, the current flow involved in the locking process is reduced and a better noise performance is achieved.

Figure 9:
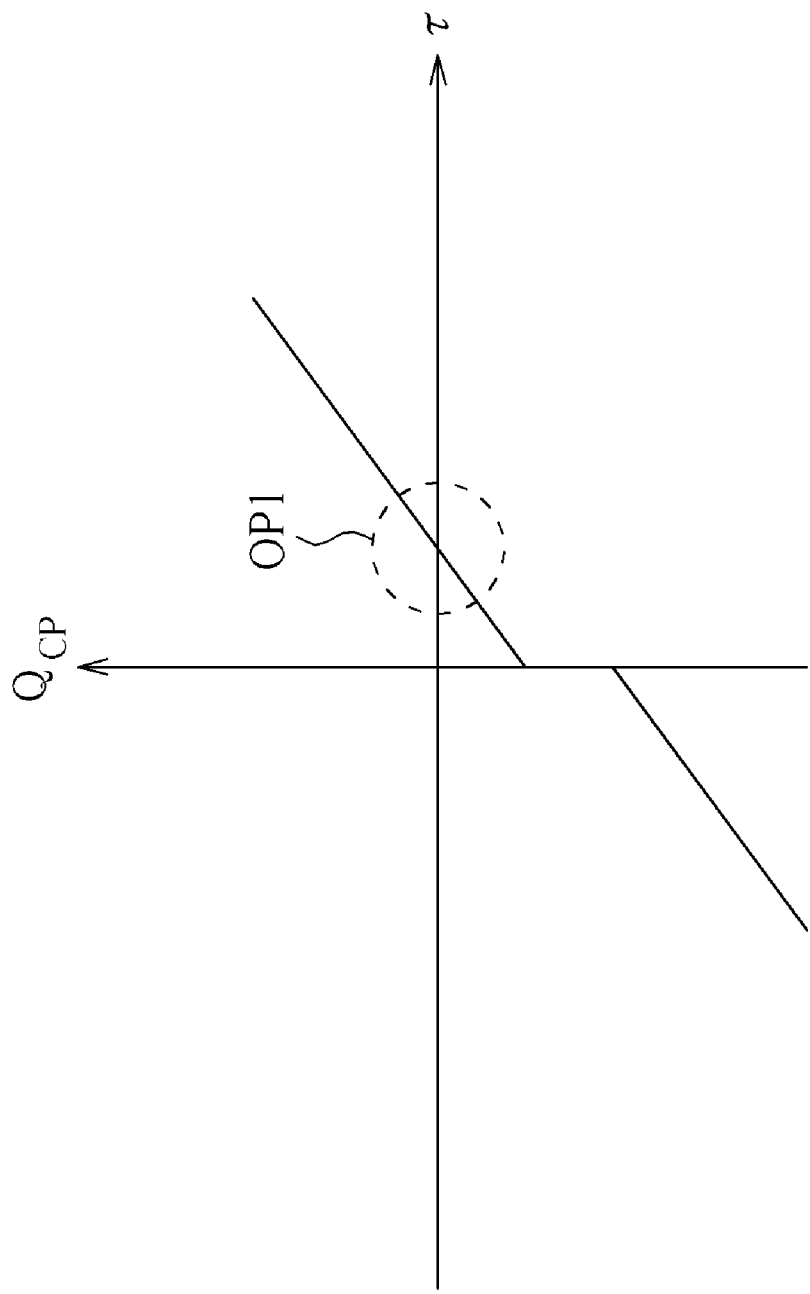
FIG. 9 is an exemplary electrical charges V.S. phase difference diagram of the CP in FIG. 3 according to an embodiment of the present invention.

Please refer to FIG. 9 for more details of the CP of the present invention. FIG. 9 is an exemplary electrical charge $Q_{CP}$ v.s. phase difference τ diagram of the CP 3000 in FIG. 3 according to an embodiment of the present invention. The electrical charges $Q_{CP}$ are injected by the CP 3000, and the phase difference τ is calculated from a difference between an input clock signal and a reference clock signal from a PFD (e.g., the PFD 800 shown in FIG. 8) preceding the CP 3000. Due to the offset element 3300, the CP 3000 works in a linear operation region OP1 when in the phase-locked state. Please note that, on the right half plane of the diagram (i.e., when a leading phase is detected), only the sourcing element 3100 and the offset element 3300 are conducting electrical charges to an output terminal N, and the draining element 3200 is disabled; on the left half plane of the diagram (i.e., when a lagging phase is detected), the sourcing element 3100, the draining element 3200 and the offset element 3300 are all conducting electrical charges via the output terminal N, and the draining element 3200 is triggered when encountering a phase transition between the leading phase and the lagging phase and conducts a predetermined quantity of electrical charges via the output terminal N.

In summary, the above embodiments provide a charge pump having selectively conducting current branches to conduct electrical charge via an output terminal of the charge pump according to the operating modes. In addition, a PFD capable of distinguishing operating phase regions to provide appropriate control signals is also disclosed to operate with the charge pump. Thus, the overall noise performance of the phase locking system containing the PFD and the charge pump can be enhanced with a smaller chip area.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A charge pump, being disposed in a phase locking system, the charge pump comprising:
    a sourcing element, arranged to selectively source a first current into an output terminal of the charge pump according to a first control signal;
    a draining element, arranged to selectively drain a second current from the output terminal according to a second control signal; and
    an offset element, arranged to selectively conduct an offset current via the output terminal according to a third control signal, wherein one of the sourcing element and the draining element is disabled when the phase locking system is in a phase-locked state.

2. The charge pump of claim 1, wherein the offset element, the sourcing element and the draining element are enabled to be conductive simultaneously before the phase locking system is in the phase-locked state.

3. The charge pump of claim 1, wherein the third control signal is derived from a periodic signal.

4. The charge pump of claim 3, being disposed in a phase locking system, wherein each period of the third control signal comprises an operation interval; when the phase locking system is in a phase-locked state, one of the sourcing element and the draining element is disabled, and a quantity of electrical charges conducted by the other one of the sourcing element and the draining element is substantially identical to a quantity of electrical charges conducted by the offset element during the operation interval.

5. The charge pump of claim 3, being disposed in a phase locking system which comprises a loop filter coupled to the charge pump for conducting a current via the output terminal of the charge pump according to the third control signal.

6. The charge pump of claim 5, wherein the loop filter comprises a switching element for selectively connecting the output terminal of the charge pump to a voltage controlled node according to the third control signal, when the third control signal is indicative of a holding operation, the offset element conducts the offset current via the output terminal and the output terminal of the charge pump is electrically isolated from the voltage controlled node; when the third control signal is indicative of a sampling operation, the offset element is electrically isolated from the output terminal and the output terminal of the charge pump is coupled to the voltage controlled node via the switching element.

7. The charge pump of claim 5, wherein the phase locking system further comprises a phase/frequency detector (PFD) for generating the first control signal and the second control signal to the charge pump.

8. The charge pump of claim 1, wherein the offset current is smaller than the first current or the second current.

9. The charge pump of claim 1, wherein the offset element comprises:
 an offset element, having an offset output node for conducting the offset current; and
 an offset switch element, coupled to the offset output node of the offset element, the offset switch element arranged to conduct the offset current via the output terminal according to the third control signal.

10. A charge pump, arranged to conduct electrical charges via an output terminal according to a phase information, characterized in that:
 when receiving the phase information indicative of a leading phase, the charge pump conducts the electrical charges into/from the output terminal at a predetermined rate; when receiving the phase information indicative of a lagging phase, the charge pump conducts the electrical charges from/into the output terminal at the predetermined rate; and the charge pump conducts a predetermined quantity of electrical charges via the output terminal when the phase information is indicative of a transition between the leading phase and the lagging phase.

11. The charge pump of claim 10, wherein the charge pump comprises:
 a first current source, arranged to conduct the predetermined quantity of electrical charges via the output terminal when the phase information is indicative of the transition between the leading phase and the lagging phase, and the first current source is disabled when the phase information is indicative of a phase-clocked status.

12. The charge pump of claim 10, wherein the charge pump further receives a periodic control signal comprising an operation interval in each period, and the charge pump conducts the electrical charges via the output terminal according to the phase information and the periodic control signal; and the charge pump further comprises:
 a second current source, arranged to conduct a first quantity of electrical charges via the output terminal during the operation interval; and
 an offset element, arranged to conduct a second quantity of electrical charges substantially identical to the first quantity of electrical charges via the output terminal during the operation interval.

13. A charge pump method utilized in a phase locking system, comprising:
 selectively performing a sourcing operation to source a first current into an output terminal of a charge pump in the phase locking system according to a first control signal;
 selectively performing a draining operation to drain a second current from the output terminal according to a second control signal; and
 selectively performing an offset operation to conduct an offset current via the output terminal according to a third control signal, wherein one of the sourcing and the draining operations is disabled when the phase locking system is in a phase-locked state.

14. The charge pump method of claim 13, wherein the offset operation, the sourcing opeartion and the draining opeartion are performed simultaneously before the phase locking system is in the phase-locked state.

15. The charge pump method of claim 13, wherein the third control signal is derived from a periodical signal.

16. The charge pump method of claim 15, wherein each period of the third control signal comprises an operation interval; when the phase locking system is in the phase-locked state, a quantity of electrical charges conducted via the other one of the sourcing and the draining operations is substantially identical to a quantity of electrical charges conducted by the offset current during the operation interval.

17. The charge pump method of claim 13, wherein the offset current is smaller than the first current or the second current.

18. A charge pump method, arranged to conduct electrical charges via an output terminal according to a phase information, comprising:
 when receiving the phase information indicative of a leading phase, conducting the electrical charges into/from the output terminal at a predetermined rate;
 when receiving the phase information indicative of a lagging phase, conducting the electrical charges from/into the output terminal at the predetermined rate; and
 conducting a predetermined quantity of electrical charges via the output terminal when the phase information is indicative of a transition between the leading phase and the lagging phase.

19. The charge pump method of claim 18, wherein the step of conducting the predetermined quantity of electrical charges comprises:
 providing a first current to conduct the predetermined quantity of electrical charges via the output terminal when the phase information is indicative of the transition between the leading phase and the lagging phase; and
 stopping conducting the first current to the output terminal when the phase information is indicative of a phase-locked state.

20. The charge pump method of claim 19, further comprising
 receiving a periodic control signal comprising an operation interval in each period, where the electrical charge is conducted via the output terminal according to the phase information and the periodic control signal;
 providing a second current to conduct a first quantity of electrical charges via the output terminal during the operation interval; and
 providing an offset current to conduct a second quantity of electrical charges substantially identical to the first quantity of electrical charges via the output terminal during the operation interval.

* * * * *